United States Patent
Chien et al.

(10) Patent No.: US 12,338,369 B2
(45) Date of Patent: Jun. 24, 2025

(54) NITRIDE INHIBITORS FOR HIGH SELECTIVITY OF TiN—SiN CMP APPLICATIONS

(71) Applicant: CMC Materials LLC, Aurora, IL (US)

(72) Inventors: Chih-Hsien Chien, Kaohsiung (TW); Yi-Hong Chiu, Linluo Township (TW); Hung-Tsung Huang, Tainan (TW); Ming-Chih Yeh, Linkou Township (TW)

(73) Assignee: CMC Materials LLC, Aurora, IL (US)

( * ) Notice: Subject to any disclaimer, the term of this patent is extended or adjusted under 35 U.S.C. 154(b) by 0 days.

(21) Appl. No.: 18/593,811

(22) Filed: Mar. 1, 2024

(65) Prior Publication Data

US 2024/0199917 A1  Jun. 20, 2024

Related U.S. Application Data

(62) Division of application No. 15/706,192, filed on Sep. 15, 2017, now abandoned.

(51) Int. Cl.
| | |
|---|---|
| *C09G 1/02* | (2006.01) |
| *B24B 1/00* | (2006.01) |
| *B24B 37/04* | (2012.01) |
| *C09G 1/00* | (2006.01) |
| *C09G 1/04* | (2006.01) |
| *C09G 1/06* | (2006.01) |
| *C09K 3/14* | (2006.01) |
| *C09K 13/06* | (2006.01) |
| *H01L 21/3105* | (2006.01) |
| *H01L 21/321* | (2006.01) |
| *H01L 21/3213* | (2006.01) |

(52) U.S. Cl.
CPC .............. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1436* (2013.01); *C09K 3/1454* (2013.01); *C09K 13/06* (2013.01); *H01L 21/31053* (2013.01); *H01L 21/3212* (2013.01); *H01L 21/3213* (2013.01)

(58) Field of Classification Search
None
See application file for complete search history.

(56) References Cited

U.S. PATENT DOCUMENTS

| | | |
|---|---|---|
| 5,196,353 A | 3/1993 | Sandhu |
| 5,433,651 A | 7/1995 | Lustig |
| 5,609,511 A | 3/1997 | Moriyama |
| 5,643,046 A | 7/1997 | Katakabe |
| 5,658,183 A | 8/1997 | Sandhu |
| 5,838,447 A | 11/1998 | Hiyama |
| 5,872,633 A | 2/1999 | Holzapfel |
| 5,893,796 A | 4/1999 | Birang |
| 5,949,927 A | 9/1999 | Tang |
| 5,958,288 A | 9/1999 | Mueller |
| 6,068,787 A | 5/2000 | Grumbine |
| 9,486,892 B2 | 11/2016 | Onishi |
| 2007/0157524 A1* | 7/2007 | Lortz ............... C09G 1/02 51/308 |
| 2015/0083689 A1 | 3/2015 | Pallikkara Kuttiatoor |
| 2015/0221521 A1 | 8/2015 | Hou |
| 2016/0358790 A1* | 12/2016 | Shi ............... H01L 21/31053 |
| 2017/0107404 A1 | 4/2017 | Kim |

FOREIGN PATENT DOCUMENTS

| | | |
|---|---|---|
| JP | 2011517507 A | 6/2011 |
| JP | 2014532305 A | 12/2014 |
| JP | 2017510977 A | 4/2017 |
| JP | 2017114966 A | 6/2017 |
| KR | 20100065386 A | 6/2010 |
| KR | 20110007143 A | 1/2011 |
| KR | 20110104443 A | 9/2011 |
| KR | 20160015908 A | 2/2016 |
| KR | 20170044522 A | 4/2017 |
| KR | 20170068584 A | 6/2017 |
| WO | 03050864 A2 | 6/2003 |
| WO | 2014069457 A1 | 5/2014 |

\* cited by examiner

*Primary Examiner* — Jiong-Ping Lu

(57) ABSTRACT

The invention provides a chemical-mechanical polishing composition comprising (a) abrasive particles, b) a removal rate inhibitor selected from (I) a surfactant comprising a polyoxyalkylene functional group and a sulfonate functional group, (II) a surfactant comprising a polyoxyalkylene functional group and a sulfate functional group, (III) a first surfactant comprising a polyoxyalkylene functional group and a second surfactant comprising a sulfonate functional group, and (IV) a first surfactant comprising a polyoxyalkylene functional group and a second surfactant comprising a sulfate functional group, and (c) an aqueous carrier. The invention also provides a method of chemically-mechanically polishing a substrate comprising TiN and SiN with the inventive chemical-mechanical polishing composition.

13 Claims, No Drawings

NITRIDE INHIBITORS FOR HIGH SELECTIVITY OF TiN—SiN CMP APPLICATIONS

BACKGROUND OF THE INVENTION

In manufacturing of advanced semiconductor devices (both memory and logic) certain integration schemes require a selective removal of a metals (e.g., Cu, CuMn, Ta, TaN, Al, AlCo, Co, CoMo, Ru, RuTa, RuTiN, Mn, TiN (self-stop), W, Pt), dielectrics (e.g., silicon oxide, silicon nitride, silicon carbide, polysilicon), or polymers (e.g., photoreactive (PR), spin-on glass (SOG) type oxide) with cessation of removal upon reaching a barrier layer (commonly referred to as "stop on barrier"). Compositions and methods for chemical-mechanical polishing (CMP) of the surface of a substrate are well known in the art. Polishing compositions (also known as polishing slurries, CMP slurries, and CMP compositions) for CMP of surfaces of semiconductor substrates (e.g., for integrated circuit manufacture) typically contain an abrasive and various additive compounds. In the case of barrier layers formed from titanium nitride (TiN) and silicon nitride (SiN), the stop on barrier process can be difficult since typical CMP compositions are not particularly selective for removal of the overlying metal layer relative to the TiN or SiN layer.

One particular application of the stop on barrier technique is in tungsten gate formation, which involves CMP removal of a tungsten layer disposed on a barrier layer over an oxide substrate. A depression in oxide substrate is lined with a portion of the barrier layer and filled with the tungsten metal. During polishing, the tungsten layer is removed by CMP down to a planar portion of the barrier layer. A portion of tungsten within depression then is removed by polishing to form a gate structure. One major difficulty in the stop on barrier technique is undesired removal of the planar portion of the barrier layer, which can lead to a lower gate height or other problems. Often, CMP compositions are not selective enough to reliably and consistently stop material removal when the barrier layer is exposed. By way of example, obtaining a suitable selectivity of TiN and SiN is desirable for tungsten gate buffing applications as TiN and SiN selectivity plays a role in controlling gate height.

Despite the current understanding of CMP compositions and methods, there remains a need in the art for a CMP composition and method that provide suitable metal layer removal (e.g., tungsten) over a barrier layer (e.g., TiN or SiN) while obtaining suitable barrier layer selectivity (TiN:SiN). The methods and compositions described herein address this need.

BRIEF SUMMARY OF THE INVENTION

The present invention provides CMP compositions and methods suitable for polishing a substrate, for example, a substrate comprising TiN and SiN.

The invention provides a chemical-mechanical polishing composition comprising (a) abrasive particles, (b) a removal rate inhibitor selected from (I) a surfactant comprising a polyoxyalkylene functional group and a sulfonate functional group, (II) a surfactant comprising a polyoxyalkylene functional group and a sulfate functional group, (III) a first surfactant comprising a polyoxyalkylene functional group and a second surfactant comprising a sulfonate functional group, and (IV) a first surfactant comprising a polyoxyalkylene functional group and a second surfactant comprising a sulfate functional group, and (c) an aqueous carrier.

The invention also provides a method of chemically-mechanically polishing a substrate comprising (i) providing a substrate comprising a TiN layer on a surface of the substrate and a SiN layer on a surface of the substrate; (ii) providing a polishing pad; (iii) providing a chemical-mechanical polishing composition comprising (a) abrasive particles, (b) a removal rate inhibitor selected from (I) a surfactant comprising a polyoxyalkylene functional group and a sulfonate functional group, (II) a surfactant comprising a polyoxyalkylene functional group and a sulfate functional group, (III) a first surfactant comprising a polyoxyalkylene functional group and a second surfactant comprising a sulfonate functional group, and (IV) a first surfactant comprising a polyoxyalkylene functional group and a second surfactant comprising a sulfate functional group, and (c) an aqueous carrier; (iv) contacting the substrate with the polishing pad and the chemical-mechanical polishing composition; and (v) moving the polishing pad and the chemical-mechanical polishing composition relative to the substrate to abrade at least a portion of the TiN layer on a surface of the substrate and at least a portion of the SiN layer on a surface of the substrate to polish the substrate, wherein the TiN layer is selectively removed faster than the SiN layer, and wherein the TiN:SiN removal rate selectivity is greater than 15:1.

DETAILED DESCRIPTION OF THE INVENTION

The invention provides a chemical-mechanical polishing composition comprising, consisting essentially of, or consisting of (a) abrasive particles, (b) a removal rate inhibitor, and (c) an aqueous carrier. The invention also provides a method of chemically-mechanically polishing a substrate comprising a TiN layer and a SiN layer wherein the TiN layer is selectively removed faster than the SiN layer.

The abrasive particles can be any suitable abrasive particles. Illustrative abrasive particles include, for example, metal oxide abrasive particles of alumina (e.g., aluminum oxide), silica (e.g., silicon dioxide), ceria (e.g., cerium oxide), zirconia (e.g., zirconium oxide), titania (e.g., titanium dioxide), germania (e.g., germanium dioxide, germanium oxide), magnesia (e.g., magnesium oxide), co-formed products thereof, or combinations thereof. The metal oxide abrasive particles can be any suitable type of metal oxide particles, e.g., fumed metal oxide particles, wet-process metal oxide particles (e.g., precipitated metal oxide particles or condensation-polymerized metal oxide particles), colloidal metal oxide particles, or surface-modified metal oxide particles (e.g., polymer surface-modified).

In keeping with an aspect of the inventive method, the polishing composition can comprise any suitable abrasive particle provided that the inventive polishing method results in the TiN layer being selectively removed faster than the SiN layer. In some embodiments of the inventive method, the polishing composition comprises alumina particles, wherein the alumina particles have a surface that comprises an anionic polymer.

In some embodiments, the polishing composition comprises colloidal silica particles. Illustrative colloidal silica particles include, for example, PL-3D and PL-2 colloidal silica (mean particle size of about 35 nm and about 25 nm, respectively) from FUSO Chemical Co. (Tokyo, Japan).

In a preferred embodiment, the abrasive particles are selected from alumina particles, wherein the alumina particles have a surface that comprises an anionic polymer, colloidal silica particles, and combinations thereof. In another preferred embodiment, the abrasive particles comprise, consist essentially of, or consist of alumina particles, wherein the alumina particles have a surface that comprises an anionic polymer. In yet another preferred embodiment, the abrasive particles comprise, consist essentially of, or consist of colloidal silica particles.

The alumina particles can be fumed alumina particles or non-fumed α-alumina particles. Fumed alumina particles generally are in the form of aggregates of primary particles, which aggregates are not easily degraded into individual primary particles without significant energy inputs. While the primary particles generally are spherical, the aggregates are chain-like structures of the primary particles and generally are not spherical. Non-fumed α-alumina particles are a crystalline form of alumina and typically do not form aggregates. In a preferred embodiment, the alumina particles are non-fumed α-alumina particles.

The abrasive particles (e.g., colloidal silica particles, alumina particles having a surface that comprises an anionic polymer) can have any suitable particle size. The particle size of a particle is the diameter of the smallest sphere that encompasses the particle. The abrasive particles can have an average particle size of about 10 nm or more, e.g., about 15 nm or more, about 20 nm or more, about 25 nm or more, about 35 nm or more, about 45 nm or more, about 50 nm or more, about 55 nm or more, about 60 nm or more, about 75 nm or more, or about 100) nm or more. Alternatively, or in addition, the abrasive particles can have an average particle size of about 1,000 nm or less, e.g., about 950 nm or less, about 950 nm or less, about 900 nm or less, about 850 nm or less, about 800 nm or less, about 750 nm or less, about 700 nm or less, about 650 nm or less, about 600 nm or less, about 650 nm or less, about 500 nm or less, about 475 nm or less, about 450 nm or less, about 425 nm or less, about 400 nm or less, about 375 nm or less, about 350 nm or less, about 325 nm or less, about 300 nm or less, about 275 nm or less, about 250 nm or less, about 225 nm or less, about 200 nm or less, about 175 nm or less, about 160 nm or less, about 150 nm or less, about 125 nm or less, about 115 nm or less, about 100 nm or less, about 90) nm or less, or about 80 nm or less. For example, the ceria, zirconia, silica, and alumina particles can have an average particle size of about 25 nm to about 250 nm. e.g., about 35 nm to about 200 nm, about 45 nm to about 150 nm, about 50 nm to about 125 nm, about 55 nm to about 120 nm, or about 60 nm to about 115 nm. Thus, the abrasive particles can have an average particle size bounded by any two of the aforementioned endpoints. For example, the abrasive particles can have an average particle size of about 10 nm to about 1,000 nm, about 25 nm to about 950 nm, about 30 nm to about 900 nm, about 35 nm to about 850 nm, about 40 nm to about 800 nm, about 45 nm to about 750 nm, about 50 nm to about 700 nm, about 55 nm to about 650 nm, about 60 nm to about 600 nm, about 75 nm to about 550 nm, about 100 nm to about 500 nm, about 25 nm to about 450 nm, about 30 to about 400 nm, about 35 nm to about 350 nm, about 40 nm to about 300 nm, about 45 nm to about 250 nm, or about 50 nm to about 200 nm.

The particle size of the abrasive particles can be measured using any suitable technique, for example, light scattering techniques. Suitable particle size measurement instruments are available from, for example, Malvern Instruments (Malvern, UK).

The chemical-mechanical polishing composition can comprise any suitable amount of abrasive particles. If the composition comprises too little abrasive particles, the composition may not exhibit sufficient removal rate. In contrast, if the polishing composition comprises too much abrasive particles, the composition may exhibit undesirable polishing performance, may not be cost effective, and/or may lack stability. Accordingly, the abrasive particles can be present in the polishing composition at a concentration of about 10 wt. % or less, for example, about 9 wt. % or less, about 8 wt. % or less, about 7 wt. % or less, about 6 wt. % or less, about 5 wt. % or less, about 4 wt. % or less, about 3 wt. % or less, or about 2 wt. % or less. Alternatively, or in addition, the abrasive particles can be present in the polishing composition at a concentration of about 0.001 wt. % or more, for example, about 0.005 wt. % or more, about 0.01 wt. % or more, about 0.05 wt. % or more, about 0.1 wt. % or more, about 0.5 wt. % or more, about 1 wt. % or more, or about 1.5 wt. % or more. Thus, the abrasive particles can be present in the polishing composition at a concentration bounded by any two of the aforementioned endpoints. For example, the abrasive particles can be present in the polishing composition at a concentration of about 0.001 wt. % to about 10 wt. %, e.g., about 0.005 wt. % to about 9 wt. %, about 0.01 wt. % to about 8 wt. %, about 0.05 wt. % to about 7 wt. %, about 0.1 wt. % to about 6 wt. %, about 0.5 wt. % to about 5 wt. %, about 1 wt. % to about 4 wt. %, or about 1.5 wt. % to about 3 wt. %.

In an embodiment, the abrasive particles are present in the polishing composition at a concentration of about 0.01 wt. % to about 1 wt. %. In another embodiment, the abrasive particles are present in the polishing composition at a concentration of about 0.03 wt. % to about 1 wt. %.

When the abrasive particles are suspended in the polishing composition, the abrasive particles desirably are colloidally stable. As used herein, the term "colloidally stable" refers to the suspension of abrasive particles in the liquid carrier (e.g., water) and refers to the maintenance of that suspension over time. In the context of the present invention, abrasive particles are considered colloidally stable if, when the abrasive particles are placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). The value of [B]−[T]/[C] desirably is less than or equal to 0.3, and preferably is less than or equal to 0.1.

The alumina particles preferably have a surface that comprises (e.g., is coated with) an anionic polymer. The anionic polymer interacts, typically electrostatically, with the alumina particles, which are suspended in the aqueous carrier or fixed on the polishing pad, so as to coat at least a portion of the surface of the abrasive particles. In particular, the anionic polymer associates with alumina particles that have a suitable zeta potential at the pH of the CMP composition. The zeta potential refers to the potential across the interface of solids and liquids, specifically the potential across diffuse layers of ions surrounding charged colloidal particles (e.g., alumina particles). The zeta potential of the alumina particles will vary with pH. For example, an alumina particle with a positive zeta potential can interact electrostatically with the anionic polymer. Also, an alumina particle with a slightly negative zeta potential having sufficient positive sites on the alumina particle surface can interact electrostatically with one or more anionic polymers. The alumina particles preferably have a positive zeta potential at the pH of the CMP composition. The zeta potential of the alumina particles is lowered upon interaction of the anionic polymer with the alumina particles.

Since particles of α-alumina typically have a positively-charged surface in the untreated/uncoated state, the association of the anionic polymer with particles of α-alumina results in deprotonation of at least part of the acidic functional groups on the polymer or copolymer, thus rendering the polymer negatively-charged in association with the alumina particles.

The surface of the alumina particles can be coated with any suitable amount of the anionic polymer. For example, about 5 wt. % or more (e.g., about 10 wt. % or more, about 20 wt. % or more, about 30 wt. % or more, about 50 wt. % or more, substantially all, or all) of the surface of the alumina particles can be coated with an anionic polymer. Thus, the presence of the anionic polymer can result in a partially or wholly coated abrasive (e.g., partially or wholly coated alumina particles or a partially or wholly coated abrasive polishing pad).

The anionic polymer can be any suitable anionic polymer or copolymer. Typically, the anionic polymer comprises repeating units selected from carboxylic acid functional groups, sulfonic acid functional groups, phosphonic acid functional groups, and combinations thereof. Preferably, the anionic polymer comprises repeating units selected from acrylic acid, methacrylic acid, itaconic acid, maleic acid, maleic anhydride, vinyl sulfonic acid, 2-(methacryloyloxy) ethanesulfonic acid, styrene sulfonic acid, 2-acrylamido-2-methylpropane sulfonic acid, vinylphosphonic acid, 2-(methacroyloxy)ethylphosphate, and combinations thereof. More preferably, the anionic polymer is selected from poly(2-acrylamido-2-methylpropane sulfonic acid) and polystyrene sulfonic acid.

The weight ratio of the anionic polymer to the alumina particles is generally about 0.01 or more (e.g., about 0.05 or more, about 0.1 or more, about 0.16 or more, or about 0.2 or more), based on the weight of the alumina particles. Preferably, the weight ratio of the anionic polymer to the alumina particles is about 3 or less (e.g., about 2 or less, or about 1 or less).

The alumina particles can be treated with an anionic polymer at any suitable time. For example, the alumina particles can be treated with an anionic polymer in a separate step to prepare pretreated alumina particles prior to addition of the pretreated alumina particles to the other components of the polishing composition. Alternatively, the anionic polymer can be separately added to the polishing composition before, during, or after addition of the alumina particles to the polishing composition. In this regard, the weight ratio of anionic polymer to alumina particles will be understood to refer to the total weight of anionic polymer in the polishing composition and is not limited to the weight of the anionic polymer bound to the alumina particles.

An illustrative method for preparing alumina particles having a surface that comprises an anionic polymer in accordance with the invention is as follows. Poly(2-acrylamido-2-methylpropanesulfonic acid) is dissolved in deionized water, and potassium hydroxide is added to adjust the pH to between 3 and 4. A defoaming agent is then added. Alumina particles (i.e., non-fumed α-alumina particles) are added to the mixture at a rate of 500 mL/min over a period of 40-45 minutes, and the mixture is subjected to high shear mixing for 10 minutes. The resulting polymer-coated particles have an average particle size of about 170 nm and have a zeta potential of less than −30 mV over a pH range of 2 to 9.

The chemical-mechanical polishing composition of the invention comprises a removal rate inhibitor. Preferably, the removal rate inhibitor is selected from (I) a surfactant comprising a polyoxyalkylene functional group and a sulfonate functional group, (II) a surfactant comprising a polyoxyalkylene functional group and a sulfate functional group, (III) a first surfactant comprising a polyoxyalkylene functional group and a second surfactant comprising a sulfonate functional group, and (IV) a first surfactant comprising a polyoxyalkylene functional group and a second surfactant comprising a sulfate functional group. Without wishing to be bound to any particular theory, it is believed that the surfactant(s) of the removal rate inhibitor adsorb onto the substrate during polishing. Moreover, the relative affinity of the removal rate inhibitor to the substrate is dependent, at least in part, on the nature of the substrate (e.g., structure of the substrate, geometry of the substrate, materials present on the substrate) and the polishing conditions. Thus, the polishing performance (e.g., removal rate, selectivity, defectivity, etc.) of the inventive compositions and methods on a given substrate can be altered by modifying the nature of the removal rate inhibitor.

Applicants have surprisingly discovered that the presence of a removal rate inhibitor comprising a polyoxyalkylene functional group (e.g., a polyoxyethylene functional group) in combination with one or more sulfonate ($-SO_3^-$) functional groups and/or sulfate ($-SO_4^{2-}$) functional groups in the inventive polishing composition, provides a desirable removal rate selectivity of TiN over SiN. The removal rate inhibitor advantageously improves the selectivity of TiN over SiN in the inventive polishing compositions during polishing, which facilitates improved gate-height control and TiN residue removal. Without wishing to be bound to any particular theory, it is believed that the selectivity of TiN over SiN (e.g., the ratio of TiN removal rate to SiN removal rate) can be controlled by adjusting the relative concentration of the one or more polyoxyalkylene functional groups, one or more sulfonate functional groups, and/or one or more sulfate functional groups present in the removal rate inhibitor of the inventive polishing compositions.

The removal rate inhibitor of the inventive polishing composition can be provided in any suitable manner. For example, the removal rate inhibitor of the inventive polishing composition can be provided as a single-surfactant system (e.g., a one-component system), that is, the removal rate inhibitor comprises a surfactant comprising a polyoxyalkylene functional group and a sulfonate functional group within the same surfactant molecule, or a surfactant comprising a polyoxyalkylene functional group and a sulfate functional group within the same surfactant molecule. Alternatively, the removal rate inhibitor can be provided as a multi-component system (e.g., a two-component system, or a three-component system, etc.), wherein the removal rate inhibitor can be a mixture of compounds, wherein a first surfactant comprises a polyoxyalkylene functional group and a second surfactant comprises a sulfonate and/or a sulfate functional group, wherein the mixture of compounds functions as a removal rate inhibitor as described herein. In addition, each compound of a multi-component mixture may be a surfactant, independent of the properties of the mixture. Typically, a removal rate inhibitor provided as a multi-component system comprises a first surfactant comprising a polyoxyalkylene functional group and a second surfactant comprising a sulfonate functional group, and/or comprises a first surfactant comprising a polyoxyalkylene functional group and a second surfactant comprising a sulfate functional group.

As used herein, the terms "first surfactant" and "second surfactant" are used to refer to the separate surfactants comprising the polyoxyalkylene functional group, sulfonate functional groups, and/or sulfate functional groups, and the terms do not refer to or imply an order of addition to the inventive polishing compositions.

Moreover, the terms "sulfonate" and "sulfate" as understood by a person of ordinary skill in the art refer to the anionic form of the surfactants, regardless of whether the surfactant is added to the composition in a salt form or acid form.

The polyoxyalkylene functional group of the removal rate inhibitor can be any suitable polyoxyalkylene functional group. Preferably, the polyoxyalkylene functional group is a polyoxyethylene functional group. Another illustrative polyoxyalkylene functional group is a polyoxypropylene group. By way of example, a suitable surfactant comprising a polyoxyalkylene functional group is polyoxyethylene sorbitan monolaurate (i.e., polysorbate 20 or polyoxyethylene (20) sorbitan monolaurate), which is commercially available, for example, from Croda, Inc. under the trade name TWEEN™20. Polyoxyethylene sorbitan monolaurate is a polysorbate-type nonionic surfactant formed from the ethoxylation (20 repeating units of polyethylene glycol) of sorbitan prior to the addition of lauric acid. As is known in the art, polyoxyethylene sorbitan monolaurate is readily available from various sources under a variety of tradenames.

Other suitable surfactants comprising a polyoxyalkylene functional group include, for example, polyethylene glycol (PEG), polypropylene glycol (PPG), t-octylphenoxypolyethoxyethanol (e.g. TRITON™ X-100) (Sigma-Aldrich, St. Louis, MO), nonyl phenol ethoxylate (e.g. IGEPAL™ CO-630) (Sigma-Aldrich, St. Louis, MO).

When TWEEN™20 is present in the CMP composition of the present invention, it is present with at least one or more surfactants (e.g., a second surfactant) comprising either a sulfonate functional group, or a sulfate functional group.

In keeping with an aspect of the invention, the removal rate inhibitor comprises a surfactant comprising a sulfonate functional group or a sulfate functional group. Suitable surfactants comprising a sulfonate functional group include, for example, an alpha-olefin sulfonate (AOS), polystyrene sulfonic acid (PSS), and combinations thereof.

The alpha-olefin sulfonate (AOS) can be, for example, a linear alpha-olefin. Linear alpha-olefins include, for example, 1-butene, 1-hexene, 1-octene, 1-decene, 1-dodecene, 1-tetradecene, 1-hexadecene, 1-octadecene, and the like. Also included are higher blends of $C_{20}$-$C_{24}$, $C_{24}$-$C_{30}$, and $C_{20}$-$C_{30}$ of alkenes. Typically, $C_{10}$-$C_{14}$ linear alpha olefins are used in making surfactants. By way of example, these compounds can be reacted with benzene to make linear alkyl benzene (LAB), which is further sulfonated to linear alkyl benzene sulfonate (LABS).

Polystyrene sulfonates are polymers derived from polystyrene, but which also contain sulfonate functional groups and typically are supplied in the sodium form or in the calcium form.

Other suitable surfactants comprising a sulfonate functional group are the sulfonated alkyldiphenyloxide series of anionic surfactants commercially available from Dow Chemical Company (Midland, MI) under the tradename DOWFAX™, which are characterized by the following chemical structure (I):

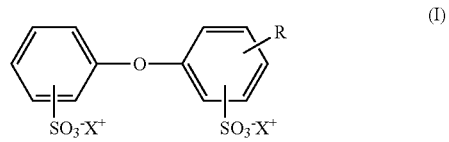

wherein R can be any suitable group, and X can be any suitable cation. In an embodiment, R is a $C_1$-$C_{30}$ linear or branched, saturated or unsaturated alkyl group. Illustrative examples of $C_1$-$C_{30}$ alkyl groups include methyl, ethyl, n-propyl, iso-propyl, sec-butyl, iso-butyl, t-butyl, pentyl, isopentyl, ethyl-hexyl, hexyl, heptyl, octyl, nonyl, decyl, dodecyl, and the like. In some embodiments, the alkyl group contains one or more heteroatoms selected from the group consisting of O and N, and $X^+$ is $H^+$ or a suitable cation. Illustrative cations include the Group IA metals (i.e., alkali metals), for example, lithium, sodium, potassium, rubidium, cesium, and francium. In a preferred embodiment, R is a compound of formula (I) is a $C_6$-$C_{22}$ alkyl group.

Examples of suitable sulfonated alkyldiphenyloxide surfactants include surfactants commercially available from the Dow Chemical Company (Midland, MI) under the trade names DOWFAX™ C10L, DOWFAX™ C6L, DOWFAX™ 3B2, and DOWFAX™ 2A1.

Other non-limiting examples of surfactants comprising a sulfonate functional group suitable in the CMP compositions described herein include alkylaryl sulfonates (e.g., alkylbenzene sulfonates such as dodecylbenzene sulfonate), alkyl sulfonates (e.g., alkylglyceride sulfonates, alkylether sulfonates and alkyl sulfoacetates), sulfosuccinates (e.g., monoalkyl sulfosuccinates, and dialkyl sulfosuccinates), acyl taurates, and acyl isethionates.

When the inventive polishing composition comprises alkylaryl sulfonates, the alkyl group can be attached to the aryl (e.g., benzene) moiety in any position relative to the sulfonic acid group. The alkyl group generally will include more than 6 carbon atoms, and can be linear or branched. A branched alkyl group can be attached to the aryl moiety through a primary carbon (e.g., a methylene group), a secondary carbon, or a tertiary carbon. A preferred alkylaryl sulfonate is dodecylbenzene sulfonate, in which the dodecyl group can be any alkyl group having a total of twelve carbons, and therefore can be linear or branched. A branched dodecyl group can be attached to the benzene moiety through a primary carbon (e.g., a methylene group), a secondary carbon, or a tertiary carbon. Preferably, the dodecyl group comprises a linear dodecyl chain attached to the benzene group via a secondary carbon atom (i.e., internally along the dodecyl chain rather than at one end of the chain).

Examples of suitable surfactants comprising a sulfate group are alkyl sulfates surfactants (e.g., lauryl sulfate), including salts thereof (e.g., sodium lauryl sulfate and ammonium lauryl sulfate).

An illustrative removal rate inhibitor comprising a first surfactant comprising a polyoxyalkylene functional group and a second surfactant comprising a sulfonate functional group is a mixture of ethoxylated $C_6$-$C_{12}$ alcohols (CAS 68439-45-2) and $C_{10}$-$C_{14}$ alkylaryl sulfonates. This mixture is commercially available, for example, from Air Products (Allentown, PA) under the tradename ZETASPERSE™ 2300.

In an embodiment, the inventive polishing composition comprises a removal rate inhibitor comprising a surfactant having both a polyoxyalkylene functional group and a sulfonate or sulfate functional group within the same surfactant molecule (i.e., single-surfactant system). An exemplary "single-surfactant" (e.g., a surfactant comprising a polyoxyalkylene functional group and a sulfate functional group within the same surfactant molecule) is ammonium laureth sulfate and salts thereof (e.g., sodium lauryl polyoxyethylene sulfate or ammonium lauryl polyoxyethylene sulfate), which is characterized by having both a polyoxyalkylene functional group and a sulfate functional group, and which is commercially available from, for example, Sino-Japan Chemical Co. under the tradename SINONATE™ 1105SF and also is available from Kao Global Chemical under the tradename EMAL™ 20A.

In a preferred embodiment, the removal rate inhibitor is selected from a lauryl polyoxyethylene ether sulfate, an alkoxylated alkanol and an alkylaryl sulfonate, a sulfonated alkylaryl oxide and an alkoxylated polysorbitan, an alpha-olefin sulfonate and an alkoxylated polysorbitan, and combinations thereof. Preferably, the removal rate inhibitor is an alkoxylated alkanol, and the alkoxylated alkanol comprises ethoxylated $C_6$-$C_{12}$ alcohols. In another preferred embodiment, the removal rate inhibitor is an alkoxylated polysorbitan, and the alkoxylated polysorbitan comprises polyoxyethylene (20) sorbitan monolaurate.

In another preferred embodiment, the removal rate inhibitor is selected from a surfactant comprising a lauryl polyoxyethylene ether sulfate, a first surfactant comprising ethoxylated $C_6$-$C_{12}$ alcohols and a second surfactant comprising $C_{10}$-$C_{14}$ alkylaryl sulfonates, a first surfactant comprising sulfonated alkyldiphenyloxides and a second surfactant comprising polyoxyethylene sorbitan monolaurate, a first surfactant comprising an alpha-olefin sulfonate and a second surfactant comprising polyoxyethylene sorbitan monolaurate, and combinations thereof.

In yet another preferred embodiment, the removal rate inhibitor comprises a first surfactant comprising ethoxylated $C_6$-$C_{12}$ alcohols and a second surfactant comprising $C_{10}$-$C_{14}$ alkylaryl sulfonates.

In still yet another preferred embodiment, the removal rate inhibitor comprises a first surfactant comprising sulfonated alkyldiphenyloxides and a second surfactant comprising polyoxyethylene sorbitan monolaurate.

As will be understood by one of ordinary skill in the art, the sulfate and sulfonate functional groups are ionizable, and thus may be present in the inventive polishing compositions in any suitable salt form.

The chemical-mechanical polishing composition can comprise any suitable amount of removal rate inhibitor. If the composition comprises too little removal rate inhibitor, the composition may not exhibit sufficient selectivity. In contrast, if the polishing composition comprises too much removal rate inhibitor, the polishing composition may exhibit undesirable polishing performance, may not be cost effective, and/or may lack stability or selectivity. Accordingly, the removal rate inhibitor can be present in the polishing composition at a concentration of about 5 wt. % or less, for example, about 4.5 wt. % or less, about 4 wt. % or less, about 3.5 wt. % or less, about 3 wt. % or less, about 2.5 wt. % or less, about 2 wt. % or less, about 1.5 wt. % or less, or about 1 wt. % or less. Alternatively, or in addition, the removal rate inhibitor can be present in the polishing composition at a concentration of about 0.001 wt. % or more, for example, about 0.005 wt. % or more, about 0.01 wt. % or more, about 0.05 wt. % or more, about 0.1 wt. % or more, or about 0.5 wt. % or more. Thus, the removal rate inhibitor can be present in the polishing composition at a concentration bounded by any two of the aforementioned endpoints.

For example, the removal rate inhibitor can be present in the polishing composition at a concentration of about 0.001 wt. % to about 5 wt. %, e.g., about 0.005 wt. % to about 4.5 wt. %, about 0.01 wt. % to about 4 wt. %, about 0.05 wt. % to about 3.5 wt. %, about 0.1 wt. % to about 3 wt. %, about 0.5 wt. % to about 2.5 wt. %, or about 1 wt. % to about 2 wt. %.

In an embodiment, the removal rate inhibitor is present in the polishing composition at a concentration of about 0.005 wt. % to about 1 wt. %. In another embodiment, the removal rate inhibitor is present in the polishing composition at a concentration of about 0.1 wt. %.

The polishing composition includes an aqueous carrier. The aqueous carrier comprises, consists essentially of, or consists of water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The inventive polishing composition has an acidic pH (i.e., less than 7). For example, the polishing composition can have a pH of about 6.5 or less, e.g., about 6 or less, about 5.5 or less, about 5 or less, about 4.5 or less, or about 4 or less. Alternately, or in addition, the polishing composition can have a pH of about 1.0 or more, e.g., about 1.5 or more, about 2.0 or more, about 2.5 or more, about 3.0 or more, or about 3.5 or more. Thus, the polishing composition can have a pH bounded by any two of the aforementioned endpoints. For example, the polishing composition can have a pH of about 1.0 to about 7, about 1.5 to about 6.5, about 2.0 to about 6.0, about 2.5 to about 5.5, about 3.0 to about 5.0, about 3.5 to about 4.5, or about 4. Typically, the polishing composition has a pH of about 1 to about 5.

In a preferred embodiment, the polishing composition has a pH of about 2 to about 4.

The polishing composition optionally further comprises one or more compounds capable of maintaining the pH within a particular range (e.g., a pH regulating agent or buffer). The buffer is capable of maintaining an acidic pH of the polishing composition. The polishing composition can comprise any suitable buffer provided that the buffer is water-soluble and compatible with the other components of the composition. For example, the inclusion of a buffer in the polishing composition should not result in an unstable polishing composition or unsuitable polishing performance. Suitable buffers are known in the art. In some embodiments, the polishing composition comprises more than one buffer. Illustrative buffers include potassium acetate, potassium carbonate, and mixtures thereof.

The polishing composition can comprise any suitable amount of buffer, when present. The polishing compositions can contain an amount of buffer to maintain the desired pH while maintaining the desired polishing performance. If the concentration of the buffer(s) in the polishing composition is too low, the pH may not be maintained in an acceptable range (i.e., acidic). Alternatively, if the concentration of the buffer(s) is too high, the polishing composition may exhibit undesirable polishing performance, may not be cost effective, and/or may lack stability.

The inventive polishing composition optionally further comprises one or more pH regulating agents. As will be understood by one of ordinary skill in the art, the pH regulating agent is added to adjust (e.g., regulate) the pH of the polishing composition. The polishing composition can comprise any suitable pH regulating agent provided that the pH regulating agent is compatible with the other components of the polishing composition. In an embodiment, the pH regulating agent is potassium hydroxide. In another embodiment, the pH regulating agent is nitric acid.

The polishing composition optionally further comprises additional components (i.e., additives) as needed. For example, depending on the desired polishing application, the inventive polishing composition can comprise one or more additives to improve or enhance the polishing performance. The additives desirably are compatible with other components of the polishing composition. In an embodiment, the inventive polishing composition further comprises an additive selected from surfactants, catalysts, oxidizing agents, stabilizers, corrosion inhibitors, biocides, and combinations thereof.

In a preferred embodiment, the polishing composition further comprises a catalyst or a corrosion inhibitor. In keeping with an aspect of the invention, the polishing composition can comprise both a catalyst and a corrosion inhibitor, as needed, to obtain desirable polishing performance. In another preferred embodiment, the polishing composition further comprises a corrosion inhibitor.

In an embodiment, the polishing composition of the invention can comprise one or more oxidizing agents. The oxidizing agent oxidizes a metal layer to its corresponding oxide or hydroxide, e.g., aluminum to aluminum oxide, titanium to titanium oxide, tungsten to tungsten oxide, and copper to copper oxide. The polishing composition can comprise any suitable oxidizing agent provided that the oxidizing agent is water-soluble and compatible with the other components of the composition. For example, the inclusion of an oxidizing agent in the polishing composition should not result in an unstable polishing composition or unsuitable polishing performance. Moreover, a person of ordinary skill in the art will understand that the choice of oxidizing agent should be compatible with the particular polishing application. For example, in some polishing applications it may be undesirable that the substrate is contaminated by an alkali metal, alkaline earth metal, halide. The oxidizing agent may be added to the polishing composition during the slurry manufacturing process or just prior to the CMP operation (e.g., in a tank located at the semiconductor fabrication facility).

Suitable oxidizing agents are known in the art and include, for example, peroxides (e.g., hydrogen peroxide and its adducts such as urea hydrogen peroxide; percarbonates; organic peroxides such as benzoyl peroxide, peracetic acid, and di-t-butyl peroxide; monopersulfates ($SO_5^{-2}$), dipersulfates ($SO_2O_8^{-2}$), and sodium peroxide), potassium nitrate, and potassium iodate. Other illustrative oxidizers include compounds having an element in its highest oxidation state (e.g., periodic acid, periodate salts, perbromic acid, perbromate salts, perchloric acid, perchloric salts, perboric acid, perborate salts, and permanganates). Still other illustrative oxidizers include non-per compounds (e.g., bromates, chlorates, iodates, iodic acid, and cerium (IV) compounds such as ammonium cerium nitrate). In some embodiments, the polishing composition comprises more than one oxidizing agent.

In a preferred embodiment, the oxidizing agent is hydrogen peroxide.

The polishing composition of the invention can comprise any suitable amount of oxidizing agent, when present. If the concentration of the oxidizing agent(s) in the polishing composition is too low, the metal substrate will not be oxidized to the metal oxide at a suitable rate, thereby hindering polishing performance (low removal rate and/or poor defect performance). In contrast, if the concentration of the oxidizing agent(s) in the polishing composition is too high, the polishing composition may exhibit undesirable polishing performance, may not be cost effective, and/or may lack stability. Accordingly, the oxidizing agent can be present in the polishing composition at a concentration of about 0.1 wt. % to about 10 wt. %, e.g., about 0.1 wt. % to about 6 wt. %, about 0.2 wt. % to about 5 wt. %, about 0.3 wt. % to about 4 wt. %, about 0.5 wt. % to about 3 wt. %, or about 0.25 wt. % to about 2 wt. %. For example, the oxidizing agent can be present in the polishing composition at a concentration of about 1 wt. %.

In some embodiments of the present invention, the polishing composition further comprises a catalyst (e.g., an accelerator). By way of example, for tungsten polishing applications, the polishing composition can comprise an iron-containing accelerator as a suitable catalyst. An iron-containing accelerator is an iron-containing chemical compound that increases the removal rate of tungsten during a tungsten CMP operation. For example, the iron-containing accelerator may include an iron-containing catalyst such as is disclosed in U.S. Pat. Nos. 5,958,288 and 5,980,775. The iron-containing catalyst may be soluble in the aqueous carrier and may include, for example, ferric (iron III) or ferrous (iron II) compounds such as iron nitrate, iron sulfate, and iron halides, including fluorides, chlorides, bromides, and iodides, as well as perchlorates, perbromates and periodates, and organic iron compounds such as iron acetates, acetylacetonates, citrates, gluconates, malonates, oxalates, phthalates, and succinates, and combinations thereof. In an embodiment, the catalyst is ferric nitrate.

The polishing composition can comprise any suitable amount of a catalyst. If the composition comprises too little catalyst, the composition may not exhibit sufficient polishing performance. In contrast, if the polishing composition comprises too much catalyst, the composition may not be cost effective and/or may lack stability. Accordingly, the polishing composition can comprise about 5 wt. % or less of a catalyst, for example, about 4 wt. % or less, about 3 wt. % or less, or about 2 wt. % or less. Alternatively, or in addition, the polishing composition can comprise about 0.005 wt. % or more of a catalyst, for example, about 0.01 wt. % or more, about 0.05 wt. % or more, about 0.1 wt. % or more, about 0.5 wt. % or more, about 1 wt. % or more, or about 1.5 wt. % or more. Thus, the polishing composition can comprise a catalyst in an amount bounded by any two of the aforementioned endpoints. For example, the polishing composition can comprise a catalyst in an amount of about 0.005 wt. % to about 5 wt. %, e.g., about 0.01 wt. % to about 4 wt. %, about 0.05 wt. % to about 3 wt. %, about 0.1 wt. % to about 2 wt. %, or about 0.5 wt. % to about 1 wt. %.

In an embodiment, the polishing composition comprises a catalyst in an amount of about 0.01 wt. % to about 0.5 wt. % (e.g., about 0.025 wt. % or about 0.05 wt. %). In another embodiment, the polishing composition comprises a catalyst in an amount of about 0.05 wt. %.

In some embodiments, the polishing composition comprising an iron-containing accelerator may further include a stabilizer. Without wishing to be bound to any particular theory, it is believed that the stabilizer prevents the iron-containing accelerator from degrading the oxidizing agent over time. The addition of a stabilizer reduces the effectiveness of the iron-containing accelerator such that the choice of the type and amount of stabilizer added to the polishing composition may have a significant impact on CMP performance. Without wishing to be bound to any particular theory, it is believed that the addition of a stabilizer may lead to the formation of a stabilizer/accelerator complex that inhibits the accelerator from reacting with the oxidizing agent while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition. Preferred organic acids include acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. In an embodiment, the organic acid is malonic acid. Stabilizers that comprise an acid may be used in their conjugate form, e.g., the carboxylate can be used instead of the carboxylic acid. The term "acid," as it is used to describe suitable stabilizers, also includes the conjugate base (or bases) of the acid stabilizer. For example, the term "adipic acid" includes adipic acid and its conjugate bases. Stabilizers can be used alone or in combination and significantly decrease the rate at which oxidizers such as hydrogen peroxide decomposes.

The polishing composition can comprise any suitable amount of a stabilizer. If the composition comprises too little of a stabilizer, the composition may not exhibit sufficient polishing performance. In contrast, if the polishing composition comprises too much of a stabilizer, the composition may not be cost effective and/or may lack stability. Accordingly, the polishing composition can comprise about 10 wt. % or less of a stabilizer, for example, about 9 wt. % or less, about 8 wt. % or less, about 7 wt. % or less, about 6 wt. % or less, about 5 wt. % or less, about 4 wt. % or less, about 3 wt. % or less, or about 2 wt. % or less. Alternatively, or in addition, the polishing composition can comprise about 0.01 wt. % or more of a stabilizer, for example, about 0.05 wt. % or more, about 0.1 wt. % or more, about 0.5 wt. % or more, about 1 wt. % or more, or about 1.5 wt. % or more. Thus, the polishing composition can comprise a stabilizer in an amount bounded by any two of the aforementioned endpoints. For example, the polishing composition can comprise a stabilizer in an amount of about 0.001 wt. % to about 10 wt. %, e.g., about 0.005 wt. % to about 9 wt. %, about 0.01 wt. % to about 8 wt. %, about 0.05 wt. % to about 7 wt. %, about 0.1 wt. % to about 6 wt. %, about 0.5 wt. % to about 5 wt. %, about 1 wt. % to about 4 wt. %, or about 1.5 wt. % to about 3 wt. %.

In an embodiment, the polishing composition comprises a stabilizer in an amount of about 0.01 wt. % to about 1 wt. % (e.g., about 0.05 wt. %). In another embodiment, the polishing composition comprises a stabilizer in an amount of about 0.1 wt. %.

The polishing composition may optionally further include a compound that inhibits metal (e.g., tungsten) etching, that is, a corrosion inhibitor. Suitable corrosion inhibitor compounds inhibit the conversion of solid metal into soluble metal compounds while at the same time allowing for effective removal of solid metal via the CMP operation. By way of example, classes of compounds that that are useful corrosion inhibitors of tungsten etching include compounds having nitrogen containing functional groups such as nitrogen containing heterocycles, alkyl ammonium ions, amino alkyls, and amino acids (e.g., synthetic and naturally occurring), as described herein. In a preferred embodiment, the polishing composition comprises a corrosion inhibitor selected from hexylamine, tetramethyl-p-phenylene diamine, octylamine, diethylene triamine, dibutyl benzylamine, aminopropylsilanol, aminopropylsiloxane, dodecylamine, tyrosine, arginine, glutamine, glutamic acid, cystine, lysine, glycine (aminoacetic acid), and combinations thereof.

The polishing composition can comprise any suitable amount of a corrosion inhibitor. If the composition comprises too little of a corrosion inhibitor, the composition may not exhibit sufficient polishing performance. In contrast, if the polishing composition comprises too much of a corrosion inhibitor, the composition may not be cost effective and/or may lack stability. Accordingly, the polishing composition can comprise about 10 wt. % or less of a corrosion inhibitor, for example, about 9 wt. % or less, about 8 wt. % or less, about 7 wt. % or less, about 6 wt. % or less, about 5 wt. % or less, about 4 wt. % or less, about 3 wt. % or less, or about 2 wt. % or less. Alternatively, or in addition, the polishing composition can comprise about 0.01 wt. % or more of a corrosion inhibitor, for example, about 0.05 wt. % or more, about 0.1 wt. % or more, about 0.5 wt. % or more, about 1 wt. % or more, or about 1.5 wt. % or more. Thus, the polishing composition can comprise a corrosion inhibitor in an amount bounded by any two of the aforementioned endpoints. For example, the polishing composition can comprise a corrosion inhibitor in an amount of about 0.01 wt. % to about 10 wt. %, e.g., about 0.05 wt. % to about 9 wt. %, about 0.1 wt. % to about 8 wt. %, or about 0.5 wt. % to about 7 wt. %, about 1 wt. % to about 6 wt. %, about 1.5 wt. % to about 5 wt. %, or about 2 wt. % to about 4 wt. %.

In an embodiment, the polishing composition comprises a corrosion inhibitor in an amount of about 0.01 wt. % to about 0.2 wt. % (e.g., about 0.05 wt. %).

The polishing composition may optionally further include a biocide (e.g., KATHON™ LX). A biocide, when present, can be any suitable biocide and can be present in the polishing composition in any suitable amount. A suitable biocide includes, for example, an isothiazolinone biocide. The amount of biocide present in the polishing composition typically is about 1 to about 50 ppm, preferably about 10 to about 20 ppm.

It will be understood that any of the components of the polishing composition that are acids, bases, or salts (e.g., anionic polymer, removal rate inhibitor, buffer, etc.), when dissolved in the aqueous carrier of the polishing composition, can exist in dissociated form as cations and anions. The amounts of such compounds present in the polishing composition as recited herein will be understood to refer to the weight of the non-dissociated compound used in the preparation of the polishing composition.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., alumina particles having a surface that comprises an anionic polymer or a removal rate inhibitor, etc.) as well as any combination of ingredients (e.g., alumina particles having a surface that comprises an anionic polymer, a removal rate inhibitor, or one or more additives, etc.).

For example, the abrasive particles can be added to the aqueous carrier (e.g., water) at the desired concentration(s). The pH can then be adjusted (as desired) and the removal rate inhibitor can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise alumina particles, a removal rate inhibitor, additive(s) (if present), and an aqueous carrier, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of chemically-mechanically polishing a substrate comprising a TiN layer and a SiN layer, wherein the TiN layer is selectively removed faster than the SiN layer.

Accordingly, the present invention provides a method of chemically-mechanically polishing a substrate comprising (i) providing a substrate comprising a TiN layer on a surface of the substrate and a SiN layer on a surface of the substrate, (ii) providing a polishing pad, (iii) providing a chemical-mechanical polishing composition comprising (a) abrasive particles, (b) a removal rate inhibitor selected from (I) a surfactant comprising a polyoxyalkylene functional group and a sulfonate functional group; (II) a surfactant comprising a polyoxyalkylene functional group and a sulfate functional group; (III) a first surfactant comprising a polyoxyalkylene functional group and a second surfactant comprising a sulfonate functional group; and (IV) a first surfactant comprising a polyoxyalkylene functional group and a second surfactant comprising a sulfate functional group; and (c) an aqueous carrier, (iv) contacting the substrate with the polishing pad and the chemical-mechanical polishing composition; and (v) moving the polishing pad and the chemical-mechanical polishing composition relative to the substrate to abrade at least a portion of the TiN layer on a surface of the substrate and at least a portion of the SiN layer on a surface of the substrate to polish the substrate, wherein the TiN layer is selectively removed faster than the SiN layer.

The polishing composition and method of the invention are useful for polishing any substrate (e.g., flat panel displays, integrated circuits, metals, inter-layer dielectric (ILD) devices, microelectromechanical systems (MEMS), ferroelectrics, magnetic heads, semiconductors, memory or rigid disks, and thin films) comprising TiN on a surface of the substrate and SiN on a surface of the substrate (e.g., a substrate comprising at least one metal layer comprising tungsten, at least one stop/barrier layer, and at least one dielectric layer). Suitable substrates also include wafers used in the semiconductor industry typically comprising, or consisting of, for example, a metal, metal oxide, metal nitride, metal composite, metal alloy, a low dielectric material, or combinations thereof. The dielectric layer can be a metal oxide, porous metal oxide, glass, organic polymer, fluorinated organic polymer, or any other suitable high or low-k insulating layer. The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, copper, tantalum, tungsten, titanium, platinum, ruthenium, iridium, aluminum, nickel, or combinations thereof. The term "layer" refers both to a continuous, bulk layer of material having a substantially homogeneous surface and to a surface comprising the material contained within a surface feature (e.g., a circuit line or a via). Advantageously, the inventive polishing composition allows for a selective removal rate for TiN relative to SiN while providing a suitable removal rate of the metal layer.

The chemical-mechanical polishing composition and method of the invention desirably exhibit a suitable removal rate for one or more metal layers and exhibit a TiN:SiN removal rate selectivity greater than 15:1, as determined by comparing the TiN removal rate to the SiN removal rate. The removal rates of the metal layer(s), stop/barrier layer(s), and dielectric layer(s) can vary depending on the polishing application and the desired topography requirements. However, regardless of the removal rates of the various films/layers present, the TiN:SiN removal rate selectivity is greater than 15:1. Not wishing to be bound to any particular theory, the TiN:SiN removal rate selectivity can be adjusted by varying the type or concentration of the various components (e.g., one or more removal rate inhibitors described herein) of the inventive polishing composition.

The chemical-mechanical polishing composition and method of the invention can be tailored to provide effective polishing at the desired polishing ranges selective to specific thin layer materials (e.g., W, TiN, SiN layer/film), while at the same time minimizing surface imperfections, defects, corrosion, erosion, dishing, and the removal of stop layers. The selectivity can be controlled, to some extent, by altering the relative concentrations of the components of the polishing composition. When desirable, the chemical-mechanical polishing composition and method of the invention can be used to polish a substrate with a titanium nitride to silicon nitride polishing removal rate selectivity of about 15:1 or higher (e.g., about 20:1, about 25:1, about 30:1, about 35:1, about 40:1, about 45:1, about 50:1, about 55:1, about 60:1, about 65:1, about 70:1, about 75:1, about 80:1, about 85:1, about 90:1, about 95:1, about 100:1, about 105:1, about 110:1, about 115:1, about 120:1, or about 125:1).

The polishing composition and method of the invention is particularly suitable for polishing a substrate comprising a SiN layer on a surface of the substrate and a TiN layer on a surface of the substrate, and is capable of providing a suitable removal rate of a metal layer while also exhibiting a suitable TiN:SiN removal rate selectivity. The polishing composition and method of the invention desirably have a suitable selectivity for TiN as compared to an insulating film (e.g., silicon oxide or silicon nitride), thereby minimizing dishing or erosion of the metal layer film that may occur when the metal layer film is more severely eroded than a neighboring insulating layer film.

In an embodiment, the polishing composition and method are suitable for polishing a substrate further comprising tungsten, for example, in tungsten gate buffing applications.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof. Soft polyurethane polishing pads are particularly useful in conjunction with the inventive polishing method. Typical pads include but are not limited to SURFIN™ 000, SURFIN™ SSW1, SPM3100 Eminess Technologies), POLITEX™ (Dow Chemical Company), and POLYPAS™ 27 (Fujibo), and EPIC™ D100 pad commercially available from Cabot Microelectronics. A particularly preferred polishing pad is the rigid, microporous polyurethane pad (IC1010™) commercially available from Dow Chemical.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

EMBODIMENTS (1) In embodiment (1) is presented a chemical-mechanical polishing composition comprising (a) alumina particles, wherein the alumina particles have a surface that comprises an anionic polymer, (b) a removal rate inhibitor selected from (I) a surfactant comprising a polyoxyalkylene functional group and a sulfonate functional group, (II) surfactant comprising a polyoxyalkylene functional group and a sulfate functional group, (III) a first surfactant comprising a polyoxyalkylene functional group and a second surfactant comprising a sulfonate functional group, and (IV) a first surfactant comprising a polyoxyalkylene functional group and a second surfactant comprising a sulfate functional group, and (c) an aqueous carrier.

(2) In embodiment (2) is presented the chemical-mechanical polishing composition of embodiment (1), wherein the wherein the alumina particles are present in the polishing composition at a concentration of about 0.001 wt. % to about 10 wt. %.

(3) In embodiment (3) is presented the chemical-mechanical polishing composition of embodiment (1) or (2), wherein the anionic polymer comprises repeating units selected from carboxylic acid functional groups, sulfonic acid functional groups, phosphonic acid functional groups, and combinations thereof.

(4) In embodiment (4) is presented the chemical-mechanical polishing composition of any one of embodiments (1)-(3), wherein the anionic polymer comprises repeating units selected from acrylic acid, methacrylic acid, itaconic acid, maleic acid, maleic anhydride, vinyl sulfonic acid, 2-(methacryloyloxy)ethanesulfonic acid, styrene sulfonic acid, 2-acrylamido-2-methylpropane sulfonic acid, vinylphosphonic acid, 2-(methacroyloxy)ethylphosphate, and combinations thereof.

(5) In embodiment (5) is presented the chemical-mechanical polishing composition of any one of embodiments (1)-(4), wherein the removal rate inhibitor is present in the polishing composition at a concentration of about 0.001 wt. % to about 5 wt. %.

(6) In embodiment (6) is presented the chemical-mechanical polishing composition of any one of embodiments (1)-(5), wherein the removal rate inhibitor comprises a polyoxyethylene group.

(7) In embodiment (7) is presented the chemical-mechanical polishing composition of any one of embodiments (1)-(6), wherein the removal rate inhibitor is selected from a surfactant comprising a lauryl polyoxyethylene ether sulfate, a first surfactant comprising ethoxylated $C_6$-$C_{12}$ alcohols and a second surfactant comprising $C_{10}$-$C_{14}$ alkylaryl sulfonates, a first surfactant comprising sulfonated alkyldiphenyloxides and a second surfactant comprising polyoxyethylene sorbitan monolaurate, a first surfactant comprising an alpha-olefin sulfonate and a second surfactant comprising polyoxyethylene sorbitan monolaurate, and combinations thereof.

(8) In embodiment (8) is presented the chemical-mechanical polishing composition of embodiment (7), wherein the removal rate inhibitor comprises a first surfactant comprising ethoxylated $C_6$-$C_{12}$ alcohols and a second surfactant comprising $C_{10}$-$C_{14}$ alkylaryl sulfonates.

(9) In embodiment (9) is presented the chemical-mechanical polishing composition of embodiment (7), wherein the removal rate inhibitor comprises a first surfactant comprising sulfonated alkyldiphenyloxides and a second surfactant comprising polyoxyethylene sorbitan monolaurate.

(10) In embodiment (10) is presented the chemical-mechanical polishing composition of any one of embodiments (1)-(9), wherein the polishing composition has a pH of about 1 to about 5.

(11) In embodiment (11) is presented the chemical-mechanical polishing composition of any one of embodiments (1)-(10), further comprising a catalyst or a corrosion inhibitor.

(12) In embodiment (12) is presented the chemical-mechanical polishing composition of any one of embodiments (1)-(11), wherein the polishing composition comprises a corrosion inhibitor, and wherein the corrosion inhibitor is selected from hexylamine, tetramethyl-p-phenylene diamine, octylamine, diethylene triamine, dibutyl benzylamine, aminopropylsilanol, aminopropylsiloxane, dodecylamine, tyrosine, arginine, glutamine, glutamic acid, cystine, lysine, glycine (aminoacetic acid), and combinations thereof.

(13) In embodiment (13) is presented a method of chemically-mechanically polishing a substrate comprising (i) providing a substrate comprising a titanium nitride (TiN) layer on a surface of the substrate and a silicon nitride (SiN) layer on a surface on the substrate; (ii) providing a polishing pad; (iii) providing a chemical-mechanical polishing composition comprising (a) abrasive particles, (b) a removal rate inhibitor selected from (I) a surfactant comprising a polyoxyalkylene functional group and a sulfonate functional group, (II) a surfactant comprising a polyoxyalkylene functional group and a sulfate functional group, (III) a first surfactant comprising a polyoxyalkylene functional group and a second surfactant comprising a sulfonate functional group, and (IV) a first surfactant comprising a polyoxyalkylene functional group and a second surfactant comprising a sulfate functional group, and (c) an aqueous carrier; (iv) contacting the substrate with the polishing pad and the chemical-mechanical polishing composition; and (v) moving the polishing pad and the chemical-mechanical polishing composition relative to the substrate to abrade at least a portion of the TiN layer on a surface of the substrate and at least a portion of the SiN layer on a surface of the substrate to polish the substrate, wherein the TiN layer is selectively removed faster than the SiN layer, and wherein the TiN:SiN removal rate selectivity is greater than 15:1.

(14) In embodiment (14) is presented the method of chemically-mechanically polishing a substrate of embodiment (13), wherein the TiN:SiN removal rate selectivity is greater than 20:1.

(15) In embodiment (15) is presented the method of chemically-mechanically polishing a substrate of embodiment (13) or (14), wherein the abrasive particles are selected from colloidal silica particles and alumina particles, wherein the alumina particles have a surface that comprises an anionic polymer.

(16) In embodiment (16) is presented the method of chemically-mechanically polishing a substrate of any one of embodiments (13)-(15), wherein the abrasive particles are alumina particles, wherein the alumina particles have a surface that comprises an anionic polymer.

(17) In embodiment (17) is presented the method of chemically-mechanically polishing a substrate of embodiments (15) or (16), wherein the anionic polymer comprises repeating units selected from acrylic acid, methacrylic acid, itaconic acid, maleic acid, maleic anhydride, vinyl sulfonic acid, 2-(methacryloyloxy)ethanesulfonic acid, styrene sulfonic acid, 2-acrylamido-2-methylpropane sulfonic acid, vinylphosphonic acid, 2-(methacroyloxy)ethylphosphate, and combinations thereof.

(18) In embodiment (18) is presented the method of chemically-mechanically polishing a substrate of any one of embodiments (13)-(17), wherein the abrasive particles are present in the polishing composition at a concentration of about 0.001 wt. % to about 10 wt. %.

(19) In embodiment (19) is presented the method of chemically-mechanically polishing a substrate of any one of embodiments (13)-(18), wherein the removal rate inhibitor comprises a polyoxyethylene group.

(20) In embodiment (20) is presented the method of chemically-mechanically polishing a substrate of any one of embodiments (13)-(19), wherein the removal rate inhibitor is selected from a surfactant comprising a lauryl polyoxyethylene ether sulfate, a first surfactant comprising ethoxylated $C_6$-$C_{12}$ alcohols and a second surfactant comprising $C_{10}$-$C_{14}$ alkylaryl sulfonates, a first surfactant comprising sulfonated alkyldiphenyloxides and a second surfactant comprising polyoxyethylene sorbitan monolaurate, a first surfactant comprising an alpha-olefin sulfonate and a second surfactant comprising polyoxyethylene sorbitan monolaurate, and combinations thereof.

(21) In embodiment (21) is presented the method of chemically-mechanically polishing a substrate of embodiment (20), wherein the removal rate inhibitor comprises a first surfactant comprising ethoxylated $C_6$-$C_{12}$ alcohols and a second surfactant comprising $C_{10}$-$C_{14}$ alkylaryl sulfonates.

(22) In embodiment (22) is presented the method of chemically-mechanically polishing a substrate of embodiment (20), wherein the removal rate inhibitor comprises a first surfactant comprising sulfonated alkyldiphenyloxides and a second surfactant comprising polyoxyethylene sorbitan monolaurate.

(23) In embodiment (23) is presented the method of chemically-mechanically polishing a substrate of any one of embodiments (13)-(22), wherein the removal rate inhibitor is present in the polishing composition at a concentration of about 0.001 wt. % to about 5 wt. %.

(24) In embodiment (24) is presented the method of chemically-mechanically polishing a substrate of any one of embodiments (13)-(23), wherein the polishing composition has a pH of about 1 to about 5.

(25) In embodiment (25) is presented the method of chemically-mechanically polishing a substrate of any one of embodiments (13)-(24), wherein the polishing compositions further comprises a catalyst or a corrosion inhibitor.

(26) In embodiment (26) is presented the method of chemically-mechanically polishing a substrate of embodiment (25), wherein the polishing composition comprises a corrosion inhibitor, and wherein the corrosion inhibitor is selected from hexylamine, tetramethyl-p-phenylene diamine, octylamine, diethylene triamine, dibutyl benzylamine, aminopropylsilanol, aminopropylsiloxane, dodecylamine, tyrosine, arginine, glutamine, glutamic acid, cystine, lysine, glycine (aminoacetic acid), and combinations thereof.

EXAMPLES

The following examples further illustrate the invention but, of course, should not be construed as in any way limiting its scope.

Unless otherwise described, TiN wafers and SiN wafers were polished separately on a GnP POLI-500 polishing device, (G&P Technology, Inc. Busan, South Korea) fitted with an EPIC D100 polishing pad (Cabot Microelectronics Corporation, Aurora, IL) under the following conditions: a downforce of 2.5 psi; a table speed of 93 rpm; a head speed of 87 rpm; a flow rate of 100 mL/min; and a polishing time of 20 s (TiN) or 3 min (SiN).

The following abbreviations are used in the examples: RR refers to removal rate; RRI refers to removal rate inhibitor; PSS refers to polystyrene sulfonic acid; and AOS refers to alpha-olefin sulfonate.

Example 1

This example demonstrates the effect of a removal rate inhibitor on the TiN:SiN selectivity of the inventive polishing method and composition.

Substrates comprising TiN or SiN were polished with nine polishing compositions (i.e., Polishing Compositions 1A-1I). Each of Polishing Compositions 1A-1I contained the following: 0.03 wt. % alumina particles treated with polysulfonic acid polymer as an abrasive and 0.5 wt. % hydrogen peroxide as an oxidizing agent. In addition, each polishing composition had a pH of 3.

Polishing Composition 1A was a control and did not contain a removal rate inhibitor.

Polishing Compositions 1B-1I were inventive and contained one or more of the following removal rate inhibitors, as indicated in Table 1: alpha-olefin sulfonate (AOS); TWEEN™20; ZETASPERSE™ 2300 (Z2300); DOWFAX™ C10L; SINONATE™ 1150SF; and/or sodium polyoxyethylene lauryl ether sulfate (EMAL™ 20C).

Polishing Compositions 1B-1E were one-component compositions wherein the removal rate inhibitor comprised a surfactant comprising a polyoxyethylene functional group and a sulfate functional group. Polishing Compositions 1F-1I were multi-component (e.g., two-component system) compositions wherein the removal rate inhibitor comprised a first surfactant comprising a polyoxyethylene functional group and a second surfactant comprising a sulfonate functional group.

The removal rate and polishing selectivity data is set forth in Table 1.

TABLE 1

Effect of Removal Rate Inhibitor on Polishing Performance

| Composition | Removal Rate Inhibitor (wt. %) | RRI Functional Group | TiN RR (Å/min) | SiN RR (Å/min) | TiN:SiN |
|---|---|---|---|---|---|
| 1A (control) | — | | 735 | 81.6 | 9.01 |
| 1B (inventive) | EMAL 20C (0.1) | $SO_4(EO)_nR$ | 151 | 1.5 | 101 |
| 1C (inventive) | SINONATE 1105SF (0.05) | $SO_4(EO)_nR$ | 217 | 2.0 | 110 |

TABLE 1-continued

Effect of Removal Rate Inhibitor on Polishing Performance

| Composition | Removal Rate Inhibitor (wt. %) | RRI Functional Group | TiN RR (Å/min) | SiN RR (Å/min) | TiN:SiN |
|---|---|---|---|---|---|
| 1D (inventive) | SINONATE 1105SF (0.1) | SO$_4$(EO)$_n$R | 228 | 2.3 | 99 |
| 1E (inventive) | SINONATE 1105SF (0.3) | SO$_4$(EO)$_n$R | 133 | 1.1 | 121 |
| 1F (inventive) | Z2300 (0.1) | PhSO$_3$/EO | 196 | 4.2 | 47 |
| 1G (inventive) | AOS (0.05)/TWEEN ™20 (0.1) | SO$_3$/EO | 312 | 4.2 | 74 |
| 1H (inventive) | DF C10L (0.0225)/TWEEN ™20 (0.1) | (PhSO$_3$)$_2$/EO | 313 | 7.6 | 41 |
| 1I (inventive) | DF C10L (0.05)/TWEEN ™20 (0.1) | (PhSO$_3$)$_2$/EO | 289 | 6.4 | 45 |

As is apparent from the results set forth in Table 1, inventive polishing compositions comprising either a one-component removal rate inhibitor (Polishing Compositions 1B-1E), or a two-component removal rate inhibitor (Polishing Composition 1F-1I) desirably exhibit a TiN:SiN removal rate selectivity greater than 15:1.

Polishing Composition 1B, which contained a removal rate inhibitor comprising a surfactant comprising a polyoxyethylene functional group and a sulfate functional group, exhibited a TiN:SiN removal rate selectivity of 101 to 1. Polishing Compositions 1C-1E, which also contained a removal rate inhibitor comprising a surfactant comprising a polyoxyethylene functional group and a sulfate functional group, exhibited TiN:SiN removal rate selectivities of 110 to 1, 99 to 1, and 121 to 1, respectively.

Polishing Composition 1F, which contained a removal rate inhibitor comprising a first surfactant comprising a polyoxyethylene functional group and a second surfactant comprising an aryl sulfonate functional group, exhibited a TiN:SiN removal rate selectivity of 47 to 1. Polishing Composition 1G, which contained a removal rate inhibitor comprising a first surfactant comprising a polyoxyethylene functional group and a second surfactant comprising a sulfonate functional group, exhibited a TiN:SiN removal rate selectivity of 74 to 1. Polishing Compositions 1H and 1I, which contained a removal rate inhibitor comprising a first surfactant comprising a polyoxyethylene functional group and a second surfactant comprising an aryl sulfonate functional group, exhibited TiN:SiN removal rate selectivities of 41 to 1 and 45 to 1, respectively.

Moreover, each of the inventive polishing compositions exhibited a greater TiN:SiN selectivity than control Polishing Composition 1A. For example, Polishing Composition 1E exhibited a TiN:SiN selectivity more than 13 times greater than Polishing Composition 1A, and each of Polishing Compositions 1B-1D exhibited a TiN:SiN selectivity more than 11 times greater than Polishing Composition 1A.

This data suggests that inventive polishing compositions containing a "one-component system" removal rate inhibitor (Polishing Compositions 1B-1E, which contained a surfactant comprising a surfactant comprising a polyoxyethylene functional group and a sulfate functional group), and inventive polishing compositions containing a "two-component system" removal rate inhibitor (Polishing Compositions 1F-1I, which contained a first surfactant comprising a polyoxyethylene functional group and a second surfactant comprising a sulfonate functional group (e.g., an aryl sulfonate functional group), desirably exhibit a TiN:SiN removal rate selectivity greater than 15 to 1. Indeed, Polishing Compositions 1B-1E, which contained a "one-component system" removal rate inhibitor exhibited a TiN:SiN removal rate selectivity greater than 95 to 1 (Polishing Composition 1D); greater than 100 to 1 (Polishing Composition 1B); greater than 105 (Polishing Composition 1C); and greater than 120 to 1 (Polishing Composition 1E). In addition, Polishing Compositions 1F-1I, which contained a "two-component system" removal rate inhibitor exhibited a TiN:SiN removal rate selectivity greater than 40 to 1 (Polishing Compositions 1H and 1I); greater than 45 to 1 (Polishing Composition 1F), and greater than 70 to 1 (Polishing Composition 1G).

Example 2

This example demonstrates the effect of a removal rate inhibitor and abrasive on the TiN:SiN selectivity of the inventive polishing method and composition.

Substrates comprising TiN or SiN were polished with eleven polishing compositions (i.e., Polishing Compositions 2A-2K). Each of Polishing Compositions 2A-2K contained alumina particles treated with polysulfonic acid polymer or colloidal silica particles (PL-3D or PL-2, FUSO) as an abrasive, and 0.5 wt. % hydrogen peroxide as an oxidizing agent. In addition, each polishing composition had a pH of 3.

Polishing Compositions 2A, 2D, and 2F were controls and did not contain a removal rate inhibitor. Polishing Compositions 2B, 2C, 2E, and 2G-2K were inventive and contained one or more of the following removal rate inhibitors, as indicated in Table 2: alpha-olefin sulfonate (AOS); TWEEN™20; ZETASPERSE™ 2300 (Z2300); DOWFAX™ C10L; SINONATE™ 1150SF; and/or sodium polyoxyethylene lauryl ether sulfate (EMAL™ 20C).

Inventive Polishing Compositions 2B, 2C, 2H, and 2I were one-component compositions wherein the removal rate inhibitor comprised a surfactant comprising a polyoxyethylene functional group and a sulfate functional group. Polishing Compositions 2E, 2G, 2J, and 2K were multi-component (e.g., two-component system) compositions wherein the removal rate inhibitor comprised a first surfactant comprising a polyoxyethylene functional group and second surfactant comprising a sulfonate functional group.

The removal rate and polishing selectivity data is set forth in Table 2.

TABLE 2

Effect of Abrasive and Removal Rate Inhibitor on Polishing Performance

| Composition | Abrasive (wt. %) | Removal Rate Inhibitor (wt. %) | RRI Functional Group | TiN RR (Å/min) | SiN RR (Å/min) | TiN:SiN |
|---|---|---|---|---|---|---|
| 2A (control) | alumina (0.03) | — | | 735 | 81.6 | 9.01 |
| 2B (inventive) | alumina (0.03) | SINONATE 1105SF (0.1) | $SO_4(EO)_nR$ | 228 | 2.3 | 99 |
| 2C (inventive) | alumina (0.1) | SINONATE 1105SF (0.1) | $SO_4(EO)_nR$ | 380 | 3.8 | 100.0 |
| 2D (control) | PL-3D (0.1) | — | | 996 | 237.8 | 4.9 |
| 2E (inventive) | PL-3D (0.1) | Z2300 (0.1) | $PhSO_3/EO$ | 124 | 4.7 | 26 |
| 2F (control) | PL-3D (1) | — | | 1154 | 465.4 | 2.480 |
| 2G (inventive) | PL-3D (1) | Z2300 (0.1) | $PhSO_3/EO$ | 223 | 9.6 | 23 |
| 2H (inventive) | PL-3D (1) | EMAL 20C (0.1) | $SO_4(EO)_nR$ | 264 | 10.3 | 25.6 |
| 2I (inventive) | PL-2 (0.1) | SINONATE 1105SF (0.1) | $SO_4(EO)_nR$ | 116 | 2.8 | 41 |
| 2J (inventive) | PL-2 (0.03) | Z2300 (0.1) | $PhSO_3/EO$ | 44 | 2.3 | 19 |
| 2K (inventive) | PL-2 (0.1) | Z2300 (0.1) | $PhSO_3/EO$ | 136 | 1.8 | 75.6 |

As is apparent from the results set forth in Table 2, the inventive polishing method and compositions comprising either a one-component removal rate inhibitor (Polishing Compositions 2B, 2C, 2H, and 2I), or a two-component removal rate inhibitor (Polishing Composition 2E, 2G, 2J, and 2K) desirably exhibit a TiN:SiN removal rate selectivity greater than 15:1.

Polishing Compositions 2B and 2C each of which comprised alumina particles treated with polysulfonic acid polymer as an abrasive and a removal rate inhibitor comprising a surfactant comprising a polyoxyethylene functional group and a sulfate functional group exhibited a TiN:SiN removal rate selectivity of about 100 to 1. Polishing Compositions 2H and 2I each of which comprised colloidal silica particles as an abrasive and a removal rate inhibitor comprising a surfactant comprising a polyoxyethylene functional group and a sulfate functional group exhibited a TiN:SiN removal rate selectivity of 25.6 to 1 (2H) and 41 to 1 (2H). Polishing Compositions 2E, 2G, 2J, and 2K each of which comprised colloidal silica particles as an abrasive and a removal rate inhibitor comprised a first surfactant comprising a polyoxyethylene functional group and second surfactant comprising a sulfonate functional group exhibited a TiN:SiN removal rate selectivity of 26 to 1 (2E), 23 to 1 (2G), 19 to 1 (2J), and 75.6 to 1 (2K).

Moreover, each of the inventive polishing compositions exhibited a greater TiN:SiN selectivity than the control polishing compositions. For example, each of inventive Polishing Compositions 2B and 2C exhibited a TiN:SiN selectivity at least 11 times greater than control Polishing Composition 1A, and inventive Polishing Composition 2E exhibited a TiN:SiN selectivity more than 5 times greater than control Polishing Composition 2D. In addition, inventive Polishing Composition 2G exhibited a TiN:SiN selectivity more than 9 times greater than control Polishing Composition 2F. Furthermore, each of inventive Polishing Compositions 2H-2K exhibited a greater TiN:SiN selectivity than any of the control compositions.

This data suggests that inventive polishing compositions containing a "one-component system" removal rate inhibitor (i.e., Polishing Compositions 2B, 2C, 2H, and 2I), and which contained abrasive particles selected from colloidal silica particles and alumina particles, wherein the alumina particles have a surface that comprises an anionic polymer and a surfactant comprising a polyoxyalkylene functional group and a sulfate functional group, and inventive polishing compositions containing a "two-component system" removal rate inhibitor (i.e., Polishing Composition 2E, 2G, 2J, and 2K), which contained colloidal silica particles as an abrasive and a first surfactant comprising a polyoxyalkylene functional group and a second surfactant comprising a sulfonate functional group), desirably exhibit a TiN:SiN removal rate selectivity greater than 15 to 1. Indeed, Polishing Composition 2C, which contained a "one-component system" removal rate inhibitor, exhibited a TiN:SiN removal rate selectivity greater than 95:1 (i.e., 100:1) in the inventive method, and Polishing Composition 2K, which contained a "two-component system" removal rate inhibitor, exhibited a TiN:SiN removal rate selectivity greater than 75:1 in the inventive method.

Example 3

This example demonstrates the effect of a removal rate inhibitor on the TiN:SiN selectivity of the inventive polishing method and composition when polishing a substrate comprising tungsten.

Substrates comprising W, TiN, and SiN were polished with seven polishing compositions (i.e., Polishing Compositions 3A-3G). Each of Polishing Compositions 3A-3G contained 0.03 wt. % alumina particles treated with polysulfonic acid polymer as an abrasive and 0.5 wt. % hydrogen peroxide as an oxidizing agent. In addition, each polishing composition had a pH of 3.

Polishing Composition 3A was a control and did not contain either a removal rate inhibitor, or a corrosion inhibitor.

Polishing Compositions 3B-3G were inventive and contained one or more of the following removal rate inhibitors, as indicated in Table 3: alpha-olefin sulfonate (AOS);

TWEEN™20; ZETASPERSE™ 2300 (Z2300); and/or sodium polyoxyethylene lauryl ether sulfate (EMAL™ 20C).

Polishing Compositions 3B and 3C were one-component compositions wherein the removal rate inhibitor comprised a surfactant comprising a polyoxyethylene functional group and a sulfate functional group. Polishing Compositions 3D-3G were multi-component (e.g., two-component system) compositions wherein the removal rate inhibitor comprised a first surfactant comprising a polyoxyethylene functional group and second surfactant comprising a sulfonate functional group.

Polishing Compositions 3C, 3E, and 3G further comprised 0.05 wt. % glycine, 0.025 wt. % ferric nitrate, and 0.054 wt. % malonic acid as corrosion inhibitors.

The removal rate and polishing selectivity is set forth in Table 3.

TABLE 3

Effect of Removal Rate Inhibitor on Tungsten Polishing Performance

| Composition | Removal Rate Inhibitor (wt. %) | RRI Functional Group | W RR (Å/min) | TiN RR (Å/min) | SiN RR (Å/min) | TiN:SiN |
|---|---|---|---|---|---|---|
| 3A (control) | — | | 67 | 735 | 81.6 | 9.01 |
| 3B (inventive) | EMAL 20C (0.1) | $SO_4(EO)_nR$ | 20 | 151 | 1.5 | 101 |
| 3C* (inventive) | EMAL 20C (0.1) | $SO_4(EO)_nR$ | 134 | 206 | 2.5 | 82 |
| 3D (inventive) | Z2300(0.1) | $PhSO_3/EO$ | 21 | 196 | 4.2 | 47 |
| 3E* (inventive) | Z2300 (0.1) | $PhSO_3/EO$ | 73 | 262 | 6.2 | 42 |
| 3F (inventive) | AOS (0.05)/ TWEEN™20 (0.1) | $SO_3/EO$ | 35 | 312 | 4.2 | 74 |
| 3G* (inventive) | AOS (0.05)/ TWEEN™20 (0.1) | $SO_3/EO$ | 72 | 403 | 5.9 | 68 |

*contains 0.05 wt. % glycine, 0.025 wt. % ferric nitrate, and 0.054 wt. % malonic acid as corrosion inhibitors As is apparent from the results set forth in Table 3, the inventive polishing method using Polishing Compositions 3B-3G comprising alumina particles treated with polysulfonic acid polymer as an abrasive and either a removal rate inhibitor comprising a surfactant comprising a polyoxyethylene functional group and a sulfate functional group (e.g., one-component system), or a removal rate inhibitor comprising a first surfactant comprising a polyoxyethylene functional group and a second surfactant comprising an aryl sulfonate functional group/sulfonate functional group (e.g., multi-component system) desirably exhibited a TiN:SiN removal rate selectivity greater than 15:1.

Indeed, Polishing Compositions 3B and 3C exhibited TiN:SiN removal rate selectivities of 101:1 and 82:1, respectively. Polishing Compositions 3D-3G exhibited TiN:SiN removal rate selectivities of 47:1, 42:1, 74:1, and 68:1, respectively.

In addition, Polishing Compositions 3C, 3E, and 3G, which further comprised a corrosion inhibitor, exhibited a higher tungsten removal rate as compared to identical polishing compositions without a corrosion inhibitor. For example, Polishing Composition 3C exhibited a tungsten removal rate of 134 angstroms per minute compared to Polishing Composition 3B (20 angstroms minute) that was more than six times higher than that of Polishing Composition 3B (i.e., 134 angstroms per minute as compared to 20 angstroms per minute). Similarly, Polishing Composition 3E exhibited a tungsten removal rate of 73 angstroms per minute that was more than 3 times higher than that of Polishing Composition 3D (i.e., 73 angstroms per minute as compared to 21 angstroms per minute). In addition, Polishing Composition 3G exhibited a tungsten removal rate of 72 angstroms per minute, which is more than two times higher than that of Polishing Composition 3H (i.e., 72 angstroms per minute as compare to 35 angstroms per minute).

This data suggests that inventive polishing method and compositions containing a "one-component system" removal rate inhibitor (i.e., Polishing Compositions 3B and 3C), and inventive polishing method and compositions containing a "two-component system" removal rate inhibitor (i.e., Polishing Composition 3D-3G), desirably exhibit a TiN:SiN removal rate selectivity greater than 40 to 1, greater than 45 to 1, greater than 65 to 1, greater than 70 to 1, greater than 80 to 1, or even greater than 100 to 1 in the inventive method. Moreover, polishing compositions further comprising a corrosion inhibitor (i.e., Polishing Compositions 3C, 3E, and 3G) exhibited a higher tungsten removal rate than those compositions without a corrosion inhibitor in the inventive method.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate comprising:
   (i) providing a substrate comprising a titanium nitride (TiN) layer on a surface of the substrate and a silicon nitride (SiN) layer on a surface of the substrate;
   (ii) providing a polishing pad;
   (iii) providing a chemical-mechanical polishing composition comprising:
      (a) abrasive particles,
      (b) a removal rate inhibitor selected from (I) a surfactant comprising a polyoxyalkylene functional group and a sulfonate functional group, (II) a surfactant comprising a polyoxyalkylene functional group and a sulfate functional group, (III) a first surfactant comprising a polyoxyalkylene functional group and a second surfactant comprising a sulfonate functional group, and (IV) a first surfactant comprising a polyoxyalkylene functional group and a second surfactant comprising a sulfate functional group, wherein the removal rate inhibitor comprises a first surfactant comprising sulfonated alkyldiphenyloxides and a second surfactant comprising polyoxyethylene sorbitan monolaurate, and
      (c) an aqueous carrier;
   (iv) contacting the substrate with the polishing pad and the chemical-mechanical polishing composition; and
   (v) moving the polishing pad and the chemical-mechanical polishing composition relative to the substrate to abrade at least a portion of the TiN layer on a surface of the substrate and at least a portion of the SiN layer on a surface of the substrate to polish the substrate, wherein the TiN layer is selectively removed faster than the SiN layer.

2. The method of claim 1, wherein the TiN:SiN removal rate selectivity is greater than 15:1.

3. The method of claim 1, wherein the abrasive particles are selected from colloidal silica particles and alumina particles, wherein the alumina particles have a surface that comprises an anionic polymer.

4. The method of claim 3, wherein the abrasive particles are alumina particles, wherein the alumina particles have a surface that comprises an anionic polymer.

5. The method of claim 4, wherein the anionic polymer comprises repeating units selected from acrylic acid, methacrylic acid, itaconic acid, maleic acid, maleic anhydride, vinyl sulfonic acid, 2-(methacryloyloxy)ethanesulfonic acid, styrene sulfonic acid, 2-acrylamido-2-methylpropane sulfonic acid, vinylphosphonic acid, 2-(methacroyloxy)ethylphosphate, and combinations thereof.

6. The method of claim 1, wherein the abrasive particles are present in the polishing composition at a concentration of about 0.001 wt. % to about 10 wt. %.

7. The method of claim 1, wherein the removal rate inhibitor comprises a polyoxyethylene group.

8. The method of claim 1, wherein the removal rate inhibitor is selected from a surfactant comprising a salt of lauryl polyoxyethylene ether sulfate, a first surfactant comprising ethoxylated $C_6$-$C_{12}$ alcohols and a second surfactant comprising $C_{10}$-$C_{14}$ alkylaryl sulfonates, a first surfactant comprising sulfonated alkyldiphenyloxides and a second surfactant comprising polyoxyethylene sorbitan monolaurate, a first surfactant comprising an alpha-olefin sulfonate and a second surfactant comprising polyoxyethylene sorbitan monolaurate, and combinations thereof.

9. The method of claim 8, wherein the removal rate inhibitor comprises a first surfactant comprising ethoxylated $C_6$-$C_{12}$ alcohols and a second surfactant comprising $C_{10}$-$C_{14}$ alkylaryl sulfonates.

10. The method of claim 1, wherein the removal rate inhibitor is present in the polishing composition at a concentration of about 0.001 wt. % to about 5 wt. %.

11. The method of claim 1, wherein the polishing composition has a pH of about 1 to about 5.

12. The method of claim 1, wherein the polishing compositions further comprises a catalyst or a corrosion inhibitor.

13. The method of claim 12, wherein the polishing composition comprises a corrosion inhibitor, and wherein the corrosion inhibitor is selected from hexylamine, tetramethyl-p-phenylene diamine, octylamine, diethylene triamine, dibutyl benzylamine, aminopropylsilanol, aminopropylsiloxane, dodecylamine, tyrosine, arginine, glutamine, glutamic acid, cystine, lysine, glycine (aminoacetic acid), and combinations thereof.

* * * * *